UNITED STATES PATENT AND TRADEMARK OFFICE
CERTIFICATE OF CORRECTION

PATENT NO. : 3,999,203
DATED : December 21, 1976
INVENTOR(S) : S. K. Lahiri

It is certified that error appears in the above—identified patent and that said Letters Patent are hereby corrected as shown below:

Column 12, line 26, change "in" to --is--.

Column 12, line 56, change "in" to --is--.

Column 12, line 59, After "Pb-In-Au" insert --Pb-Bi-In--.

Signed and Sealed this

Twenty-fifth Day of October 1977

[SEAL]

Attest:

RUTH C. MASON
*Attesting Officer*

LUTRELLE F. PARKER
*Acting Commissioner of Patents and Trademarks*

U.S. Patent  Dec. 21, 1976  3,999,203
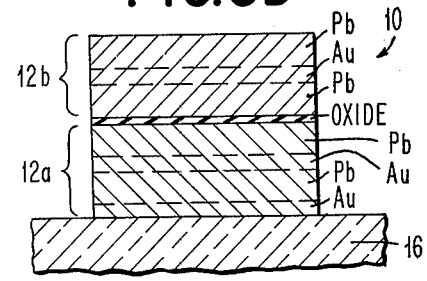
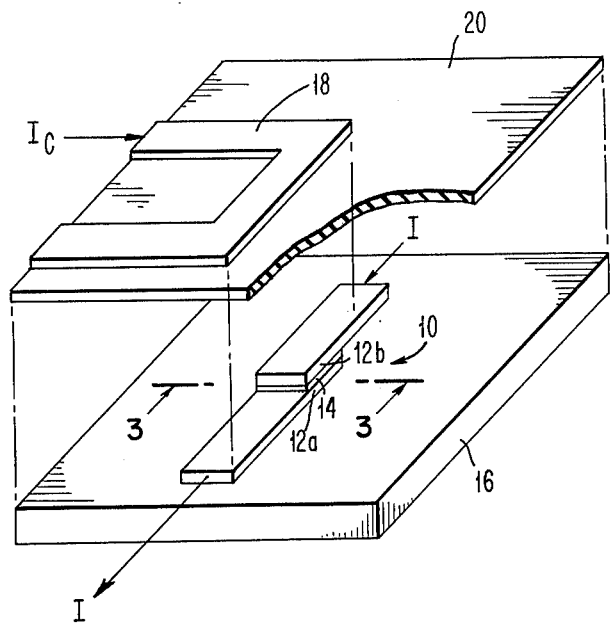
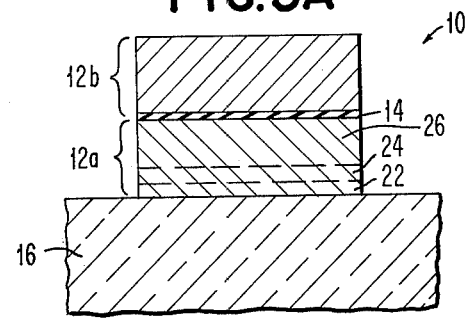
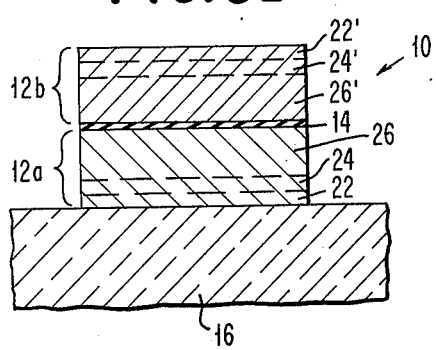
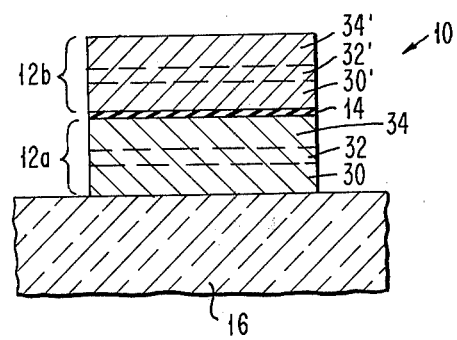
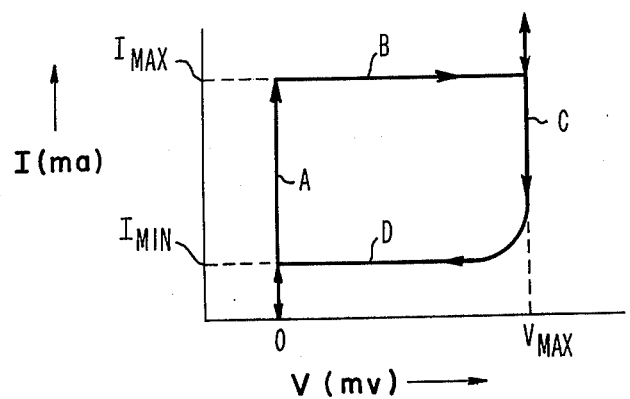
INVENTOR
SYAMAL K. LAHIRI
BY  J. E. Stanlar
AGENT

JOSEPHSON JUNCTION DEVICE HAVING INTERMETALLIC IN ELECTRODES

This is a continuation of application Ser. No. 456,099, filed Mar. 29, 1974, a continuation-in-part of application Ser. No. 279,593 filed Aug. 10, 1972, which is in turn a continuation of application Ser. No. 103,088, filed Dec. 31, 1970, now abandoned.

CROSS REFERENCE TO RELATED APPLICATION

Co-pending application Ser. No. 103,242, filed Dec. 31, 1970, now abandoned in favor of Ser. No. 551,488 filed Feb. 20, 1975, now abandoned, and assigned to the present assignee, describes a tunnel device incorporating a low diffusivity path for atoms in an electrode, thereby preventing hillock growth.

BACKGROUND OF THE INVENTION

1. Field of the Invention

This invention relates to Josephson junction devices, and more particularly to such devices having superconducting electrodes containing intermetallic regions.

2. Description of the Prior Art

Josephson junction devices are well known in the art as can be seen by referring to J. Matisoo, *Proceedings of the IEEE*, Vol. 55, No. 2, February, 1967, pp. 172–180; U.S. Pat. No. 3,281,609; and J. Matisoo, *Journal of Applied Physics*, Vol. 40, No. 4, pp. 1813–1820, March 15, 1969. In general, such devices include superconducting electrodes and a tunnel barrier therebetween. The tunnel barrier is usually an oxide of the base electrode, although other materials and oven vacuum will serve as well. The device is characterized by a very thin tunnel barrier, of the order of 3–50 angstroms, through which Josephson tunneling current can flow at zero voltage. These devices have two tunneling states; a pair tunneling state in which Josephson current exists at zero junction voltage and a single particle tunneling state in which current exists at a finite voltage. The presence of two stable states enables these devices to be capable of logical memory functions.

Fabrication of usable Josephson junction devices is generally a difficult problem. The tunneling resistance must be low in order to have high maximum Josephson currents and the devices must show good stability over repeated thermal cycling. In addition, the devices must have no transformations (material property changes) when being used or stored.

Because materials such as lead have high super-conducting-to-normal transition temperature, they are desirable for use as superconducting electrodes. However, hillock formation occurs in lead at approximately room temperature. These hillocks are mechanical protrusions which develop on the surface of the lead electrodes. Because the tunnel barrier is so thin, it is quite easy to have these hillocks break through the tunnel barrier to cause shorts across the junction. This is particularly troublesome if large arrays of these devices are to be made, since the reliability of the array will depend upon the individual reliability of each junction device.

One previous attempt to provide improved Josephson junction devices is contained in Ser. No. 889,100, filed Dec. 30, 1969 and assigned to the present assignee. That application proposed the addition of certain impurities, e.g., alloying additions, to the thin metal film electrodes to negate the driving force (or the effect of the driving force) which causes hillock formation. Induced stresses in the superconducting electrodes cause atom movement via defect movement and hillock growth will result. The impurity additions in the electrodes affect hillock growth by their interaction with the defects.

Application Ser. No. 103,236, filed Dec. 31, 1970, now U.S. Pat. No. 3,733,526 describes an improved Josephson junction device in which indium or indium and tin underlayers are used in conjuction with lead electrodes. The indium and indium/tin diffuse into the lead to become uniform alloy additions in the base electrode. The resulting Josephson junction has an improved tunnel barrier, since the resulting oxide barriers are reproducibly well controlled and of small thickness. They are also very uniform and dense even at these very small thicknesses.

Whereas research is continuing in the problem of Josephson junctions having good thermal cycling and other characteristics, this research has not developed devices and methods of fabrication which will provide good devices no matter what materials are used for electrodes.

Accordingly, it is a primary object of this invention to provide a Josephson junction device having improved stability over repeated temperature cycles.

It is another object of this invention to provide a Josephson tunneling device having improved mechanical stability and high Josephson current.

Still another object of this invention is to provide a Josephson tunneling device having improved stability and resistance to hillock growth using a wide variety of superconducting materials.

A further object of this invention is to provide an improved Josephson tunneling device which is resistant to stress relaxation processes, such as hillock growth and which has good tunneling barriers.

The foregoing and other objects, features, and advantages of the invention will be apparent from the following more particular description of the preferred embodiments of the invention as illustrated in the accompanying drawings.

SUMMARY OF THE INVENTION

Josephson tunneling devices are provided having superconducting electrodes which have intermetallic compounds formed therein. The intermetallic compounds provide suppression of stress relaxation such as hillock growth and thereby enable the Josephson devices to be temperature cycled. Any superconductor can be used for the electrodes and various elements will provide intermetallic compounds with the superconductors. In a preferred embodiment, lead is the superconducting electrode and gold, palladium, platinum, magnesium, tellurium, etc. are elements which combine with lead to form suitable intermetallic compounds.

The intermetallic compound is at least formed in the base electrode, although it can be formed in both the base electrode and the counter electrode. The element used to produce an intermetallic compound with the superconducting electrode can be deposited directly on the substrate, after which the superconducting electrode is deposited. An intermetallic compound will be formed at the junction between the superconducting electrode and the intermetallic producing element. This procedure can be repeated with the top electrode, the superconducting electrode being first deposited on the tunnel barrier, followed by a deposition of the intermetallic compound producing element.

In an alternative embodiment, the superconducting electrode is first deposited on the substrate, followed by a deposition of a thin layer of the intermetallic compound producing element, after which the remaining superconductive electrode material is deposited. This sandwich structure, having a layer of material forming an intermetallic compound with the superconductive material, is then oxidized to form the tunnel barrier. After formation of the tunnel barrier, a layer of superconducting material to be used for the counter electrode is deposited, and on this is deposited a thin layer of the element used to form an intermetallic compound with the superconductive electrode. After deposition of the thin layer of material which forms the intermetallic compound, further superconductive material is deposited on this thin layer to complete the counter electrode.

In another embodiment, the base electrode is formed by depositing a thin layer of intermetallic forming material on the substrate, followed by a deposition of the superconductive material. After this, a second thin layer of the same intermetallic forming material is deposited on the superconductor, followed by a second deposition of the same superconductive material. This forms the base electrode, which is then oxidized to provide a tunneling barrier (which can be deposited or grown on the base electrode). The counter electrode is the same, or is any of the counter electrodes described previously.

Because the materials which form intermetallic compounds with the superconducting electrodes usually do not readily dissolve into these electrodes, only a few parts per million of the material are dissolved in the electrode itself. The remaining amount of intermetallic producing material is contained in the layer of intermetallic compound or compounds while a certain amount remains almost pure and does not enter into formation of the intermetallic compound or become dissolved in the superconductive electrode. The amount of intermetallic forming material deposited is usually approximately 3 to 10 weight per cent of the electrode in which it is to be introduced. If too much of this material is used, the superconducting properties of the electrode will be changed extensively, thereby impeding device performance. For most devices, the range 2 weight percent – 20 weight percent sets the range of material provided, with respect to the total electrode.

The foregoing and other objects, features and advantages of the invention will be apparent from the following more particular description of the preferred embodiments of the invention as illustrated in the accompanying drawings.

BRIEF DESCRIPTION OF THE DRAWINGS

FIG. 1 is an illustration of a thin film Josephson device having a control line thereon.

FIG. 2 is a current versus voltage plot for a conventional Josephson junction.

FIGS. 3A–3C are cross-sectional views of the Josephson device of FIG. 1, showing different embodiments of the superconducting electrode structure. Specifically, FIG. 3A shows a Josephson device according to FIG. 1 in which a material producing an intermetallic compound with the base superconductive electrode is deposited on the substrate. FIG. 3B shows a Josephson device in accordance with FIG. 1, in which a material producing the intermetallic compound with the superconductive electrodes is deposited as a layer on the substrate and also on the top electrode. FIG. 3C is a Josephson device in which the material producing an intermetallic compound with the electrodes is deposited within the base electrode and within the counter electrode of the device.

FIG. 3D is a Josephson device whose base electrode has two layers of intermetallic forming material.

DETAILED DESCRIPTION OF THE EMBODIMENTS

In FIG. 1, a Josephson junction device 10 has a base electrode 12a and a counter electrode 12b, separated by a tunnel barrier 14. The base electrode 12a is deposited directly on the substrate 16, which can be any insulating material such as silica, glass, cork, mica, etc. Another suitable substrate is one which has a metal deposited on it, where the metal serves as a ground plane and is oxidized before formation of the Josephson device. A base electrode 12a and the counter electrode 12b can be any superconductive material, and can be made of different materials. Located over the superconductive junction device 10 is a control line 18 separated from device 10 by insulating layer 20. The control line 18 can be any superconductor, while the insulating layer 20 is any suitable electrical insulator, such as SiO or PbO.

In practice a current I (provided by a source not shown) flows through the Josephson device. In FIG. 1, current I enters the counter electrode 12b, tunnels through the tunnel barrier 14, and then exits along base electrode 12a. Of course, it is to be understood that the current flow could be in the opposite direction.

As is also well known to those familiar with Josephson current devices, the presence of a control current $I_c$ flowing through control line 18 establishes a magnetic field which intercepts the plane of the tunnel barrier 14. This magnetic field affects the threshold current of the Josephson device, either raising or lowering the threshold current.

In conventional Josephson devices, the electrodes 12a and 12b are superconductors and the tunnel barrier 14 is usually an oxide of the base electrode 12a. However, the tunnel barrier can be any of a variety of materials, including oxides, sulfides, nitrides, vacuum, etc. Some of the many suitable materials are set forth in copending application Ser. No. 875,615, filed Nov. 12, 1969, now abandoned, and assigned to the present assignee.

FIG. 2 is a current-versus voltage plot for a Josephson junction, such as is shown in FIG. 1. The device is capable of supporting a Josephson current at zero junction voltage, as is indicated by the portion of the curve labeled A. The device 10 will support this current until the threshold value ($I_{max}$) of the current flows through the device. At this point, the pair tunneling phenomenon which gives rise to Josephson current will disappear and the device will switch rapidly to a voltage state, as indicated by the portion of the curve labeled B. The device switches to a single particle tunneling state at the voltage $V_{MAX}$. If the voltage (or current) is then increased, the device will have a characteristic similar to that of normally resistive elements.

If the current or voltage is decreased, the device will follow the portions of the curve labeled C and D, to a new current $I_{MIN}$ which is greater than zero but less than $I_{MAX}$. Therefore, the device will have a hysteresis effect.

As is known in the art, this device is useful as a bistable element due to a zero voltage and a finite voltage state.

FIGS. 3A, 3B, and 3C are cross-sectional views of the Josephson device 10 taken along the lines 3–3 of FIG. 1. Each of the views 3A, 3B, or 3C shows a particular embodiment for the Josephson device of FIG. 1.

For instance, FIG. 3A shows the Josephson device of FIG. 1 (without the control line 18) in which a material capable of forming an intermetallic with the base electrode 12a is first deposited on a substrate 16. This is a thin layer comprising from 2 to 20 weight percent of the base electrode. After this, the base electrode material is deposited and an intermetallic compound will be formed at the boundary between this base electrode and the material deposited on the substrate. Because an intermetallic compound forming material has only a limited solubility in the base electrode, some of this material will remain as an almost pure layer 22, while some of it will form the intermetallic compound 24. The region 26 will be primarily the superconducting electrode material, with some small parts per million of a intermetallic forming compound interspersed therein.

In FIG. 3A assume that gold is to be used as the material which forms an intermetallic compound with a superconducting electrode, therein considered to be lead. To accomplish this, a thin layer of gold is first deposited on substrate 16. The thickness of this layer is between two and twenty weight percent of the desired lead electrode thickness. Generally about five weight percent is preferable. That is, an approximately 150 angstrom layer of gold can be deposited on substrate 16, for each 5000 angstrom deposition of lead on the gold layer.

The gold layer will be only slightly soluble in lead and a few parts per million will enter the lead electrode. Therefore the region 26 of base electrode 12a will be primarily lead with some parts per million of gold. The initial gold layer and the lead layer will form the intermetallic lead-gold compound 24. Since the gold has only a limited solubility for lead, a small layer 22 of almost pure gold will remain on substrate 16.

After formation of the base electrode 12a, this electrode is oxidized to form tunnel barrier 14. This is a thin barrier of thickness 3–50A which serves as a potential barrier for electron flow between the base electrode 12a and the counter electrode 12b. After formation of the tunnel barrier 14, the counter electrode 12b is deposited on tunnel barrier 14. In FIG. 3A, this top electrode is pure superconductive material, as for instance a lead layer of approximately 5000A thick. Thus, the structure of FIG. 3A comprises superconducting electrodes 12a and 12b, separated by a tunnel barrier 14, wherein base electrode 12a has an intermetallic compound therein.

The method by which the device of FIG. 3A is made is very straightforward and proceeds similarly to the method shown in the aforesaid U.S. Pat. No. 3,733,526. That is, the thin layer of intermetallic forming material (assume it is gold while the superconducting electrode is lead) is deposited by evaporation at room temperature on the substrate 16. This evaporation can occur at temperatures higher than room temperature, as for example temperatures between 100° C and 125° C. After deposition of the gold layer, a 5000A layer of lead is deposited at approximately room temperature on the gold layer. The lead can be evaporated at temperatures which can range between 100° C and 125° C, as can be used during the deposition of the underlying gold layer. As mentioned previously, the thickness of the gold and lead layers is such that the gold layer is approximately 2 weight percent – 20 weight percent of the lead layer. If too much gold is used, there will be an increased amount of intermetallic compound and undesirable superconducting properties will result for the base electrode. As one example, the electrode will have too low a critical transition temperature for practical device application. Generally, the lowest critical temperature $T_c$ usable for superconductive tunneling devices is approximately 4.2° K. After deposition of the lead onto the gold layer, an intermetallic compound 24 will be produced where these two materials meet. Since there is a limited solubility of gold into lead and lead into gold, some of the gold will remain as an almost pure gold layer 22, while some small amount (parts per million) of gold will diffuse into the remaining lead layer 26.

If materials other than lead and gold are used, the temperatures required for formation of intermetallic compounds may vary, but these conditions will be apparent to those skilled in the art.

After deposition of the base electrode 12a, the tunnel barrier 14 is produced, usually by oxidation of electrode 21a via plasma oxidation or thermal oxidation. That is, the tunnel barrier can be prepared by introducing oxygen into the vacuum chamber used for evaporation of the base electrode 12a. The oxidation step occurs at room temperature to 40° C and forms a dense, compact oxide of approximately 3–50A thickness.

After this, the counter electrode 12b is deposited on the tunnel barrier 14. In this specific case, a lead counter electrode is evaporated to a thickness of approximately 5000A. The same vacuum chamber is used and it is outgassed to remove oxygen gas. The lead source is then heated to a higher temperature than that used in deposition while the structure comprising the base electrode 12a and the tunnel barrier 14 is protected by a mask. After cleansing of the lead source, lead counter electrode 12b is deposited on tunnel barrier 14.

If desired, the insulating layer 20 can be formed or evaporated on the tunnel device and then the control line 18 can be evaporated, etc.

FIG. 3B shows an alternate embodiment in which the intermetallic compound is formed in both the base electrode 12a and the counter electrode 12b. As in the previous FIGS. and the ones to follow, the same reference numerals are used whenever possible.

In FIG. 3B, the base electrode 12a is the same as that in FIG. 3A. That is, base electrode 12a comprises a region 22 of pure material which forms an intermetallic compound 24 with the superconducting material used for the base electrode. The region 26 is comprised primarily of the superconducting electrode with a few parts per million of the material which forms the intermetallic compound with the superconducting electrode material.

FIG. 3B is a symmetrical device in which the counter electrode 12b is a mirror image of the base electrode 12a. The counter electrode 12b is formed on the tunnel barrier 14 and comprises region 22' which is a thin layer of the material used to provide an intermetallic compound with the superconducting counter electrode 12b. Region 24' is the intermetallic compound formed in counter electrode 12b while region 26' is comprised mainly of the superconducting material of counter electrode 12b, with some parts per million of the material comprising layer 22'. Generally, the material forming pure layers 22 and 22' is the same for both the base electrode 12a and counter electrode 12b, although this need not be so. Further, the superconducting electrode materials can be different for both the base electrode 12a and counter electrode 12b, although this need not be so.

The device of FIG. 3B is a symmetrical device in which both the base electrode and the counter electrode have intermetallic compound regions therein. This device has advantages over the device of FIG. 3A for reducing hillock growth. The intermetallic layer 24', for example, can minimize stress relaxation by defect movements inside the electrodes. Symmetrical configurations may probably produce thermodynamically more stable structures than asymmetric ones.

The device of FIG. 3B is produced in a manner similar to that of FIG. 3A. That is, the pure material used to form an intermetallic compound is deposited as a thin layer on the substrate, after which the superconducting electrode material is deposited. The proportions of these evaporated layers is the same as that described with respect to FIG. 2A. Thus, a base electrode 12a and tunnel barrier 14 are produced in the same fashion as the device of FIG. 3A. Production of the counter electrode 12b is the opposite of that for base electrode 12a. That is, the superconducting material comprising counter electrode 12b is first evaporated to a desired thickness on the tunnel barrier 14. After this, a thin layer of an intermetallic compound forming material is deposited on the superconductive material to a thickness having the same proportion as the thicknesses present in the base electrode 12a. Because there is limited solubility of the material comprising layer 22', an intermetallic compound 24' will be formed and the superconducting material in region 26' will have only very little portions of the material comprising layer 22'.

In FIG. 3C, there is shown a cross-section of a Josephson junction device 10 taken along the line 3—3 of FIG. 1. In this structure, the intermetallic compound is formed by the deposition of a thin layer of the intermetallic compound forming material midway in the base and counter electrodes. That is, a portion of the electrode is deposited and then a thin layer of the intermetallic compound forming material is deposited, after which the electrode is completed by further deposition of the superconductor to be used.

In more detail, Josephson junction device 10 (without the control line 18 and insulation 20) is deposited on substrate 16. A first portion 30 of the base electrode superconductor is deposited on substrate 16, followed by deposition of a thin layer 32 of the material used to form an intermetallic compound with the superconductor layer 30. After this, the remaining portion 34 of the base electrode is deposited. Region 34 is comprised of the same superconductor as the region 30. Therefore, the base electrode 12a comprises two layers of almost pure superconductor separated by a thin layer of material which forms an intermetallic compound with the superconductor. Of course, regions 30 and 34 may contain a small amount of the intermetallic compound forming material, even though this material has a very low solubility in the superconductor material. The intermetallic compound and almost pure compound forming material 32 will be formed between layers 30 and 34.

The relative thicknesses of layers 30, 32, and 34 is that previously stated with respect to FIGS. 3A and 3B. That is, the thickness of layer 32 is such that between 2 and 20 weight percent of that material will be present in the entire superconducting electrode 12a. Typically, layer 32 is 200A, while layers 30 and 34 combine to be approximately 5000A. Again, the criterion is that the amount of intermetallic compound forming material should be less than that which would seriously alter the superconducting properties of the base electrode, thereby rendering it non-useful in a practical Josephson junction device.

After formation of base electrode 12a, tunnel barrier 14 is formed. This barrier is of a thickness 3–50A and is usually formed by thermal oxidation or plasma oxidation, as is well known in the art.

After formation of the tunnel barrier 14, counter electrode 12b is formed in a manner identical to that used to form base electrode 12a. A first portion 30' of superconductive material to be used for the counter electrode is deposited on the tunnel barrier 14. Usually evaporation is used, although sputtering is also useful. After this, a thin layer of material 32' which will form an intermetallic compound with the superconductive material used for the counter electrode is deposited. Finally, layer 34' of the superconductive material used for counter electrode 12b is deposited . layer 32', The relative thicknesses of the layers 30', 32' and 34' is the same as that for the base electrode 12a. That is, layer 32' will comprise approximately 2–20 weight percent of the entire electrode 12b. Typically, layer 32' is 200A, while the combined thickness of layers 30' and 34' is approximately 5000A.

As an alternative to the sandwich structure of FIG. 3C, layer 34' need not be used. In this case, layer 30' of superconductive material may be approximately 5000A and layer 32' may be approximately 200A. The electrode then formed will be the same as electrode 12b of FIG. 3B.

The method of forming the structure of FIG. 3C is the same as that used to form the structures of FIGS. 3B and 3A. The superconductive electrode materials are deposited by evaporation, as are the thin layers of intermetallic compound forming material.

FIG. 3D shows a Josephson device whose base electrode 12a comprises more than one layer of intermetallic forming material. In this embodiment the superconductor is shown as lead (Pb) while the intermetallic compound forming material is gold (Au). A first layer of gold is deposited on substrate 16, followed by a deposition of lead. Then another thin layer of gold is deposited followed by a second deposition of lead. This comprises base electrode 12a. Electrode 12a is then oxidized to form the tunnel barrier 14, after which counter electrode 12b is formed. Electrode 12b can be any of the previously described counter electrodes, the one illustrated in FIG. 3D being that of FIG. 3C. As previously, the same properties for intermetallic forming layers and superconductors are used, i.e., 2–20 weight percent of intermetallic forming material in each electrode.

FIGS. 3A–3D show different Josephson junction devices having intermetallic compounds therein for reduction of stress relaxation such as hillock growth. These devices are very stable over repeated temperature cycles and have good tunnel barrier oxidation characteristics. Further, they provide high Josephson current and low tunneling resistance.

It appears that the intermetallic forming material strengthens the grain boundaries of the superconducting material used as electrode material. Also, the intermetallic compounds increase the adhesion of the base electrode superconductor, since adhesion of a superconductor to one of its intermetallics can be better than that of the superconductor to a substrate. The superconductive electrode material is stabilized by the use of the intermetallic compounds.

Also, dislocation movement which may cause stress relaxation and thereby hillock growth, is impeded by the intermetallic compound layers. The electrodes formed in this way have good storage properties at room temperature. Chemical, physical and atomic movements which would create transformations in these electrodes are minimized by the use of the intermetallics. Since these intermetallic forming materials do not go into solution readily with the superconductive electrode material, the superconducting properties of the electrodes remain good so that practical Josephson devices can be made.

Many superconductive materials can be used for the electrodes and numberous materials which form intermetallic compounds with these electrodes can be used. For instance, lead is a very suitable superconductive electrode material. Some elements which will form intermetallic compounds with lead and which are suitable are gold, palladium, platinum, magnesium and tellurium. Another suitable superconductor is indium. Materials which will form intermetallic compounds with indium are Cu, Ag, Au, Mg, Mn, Ni, Bi, etc.

Josephson tunneling devices utilizing superconductive electrodes with intermetallic compounds therein can be directly made by sequential layer fabrication as has been described. The important principle is that at least one electrode must contain an intermetallic compound and that atoms of superconducting material are present in the tunnel barrier. This principle can be achieved in structures made by sequential deposition of metallic layers. While binary alloy films have been described heretofore, ternary alloy films can also be utilized in devices following this principle.

An example of a ternary alloy system suitable for Josephson tunneling devices is Pb–Au–In. In this system, the order of the sequential deposition of the films is immaterial. For instance, Au could be first deposited, after which In could be deposited, followed by Pb. As an alternative, the positions of the Au and In layers can be interchanged. Still further, the electrode can be made by first depositing Au, followed by Pb, followed by In.

In the Pb–In–Au system, intermetallic compounds can be formed between Pb and Au, as well as between Au and In. Which intermetallic compounds are formed depends upon the relative amounts of Pb, In and Au used. For instance, film alloys containing 8 wt. % In and up to about 6 wt. % Au contain Pb-In solid solution and $AuIn_2$ (intermetallic compound) phases. However, when the Au concentration is between about 6 wt. % – 12 wt. %, the presence of an additional phase (AuIn intermetallic compound) is detected. In this three phase region of composition for the ternary system Pb–Au–In, the compostion of each phase remains invariant in accordance with the Phase Rule. Analysis of the relative line intensities of the diffraction peaks obtained by x-ray diffraction technique indicates that the proportion of AuIn increases at the expense of $AuIn_2$ as the Au concentration increases from about 6 wt. % to about 12 wt. %.

Electrodes having two phases (solid solutions and intermetallic compounds) may be the most desirable in terms of stress relaxation. That is, solid solutions having a reasonable amount of solute therein may aid in preventing hillocks. In the Pb–In–Au system, about 2–20 wt. % In in the Pb-In solid solution is suitable. For instance, a Pb–In–Au system containing 20 wt. % In may have 5 wt. % In combined with Au as an intermetallic compound, while 15 wt. % In is then present in a Pb–In solid solution. This range is typical and need not be the only range of values which will provide suitable electrodes.

The In concentration of the Ph–In phase decreases linearly from about 8 wt. % with increasing Au concentration. The third phase (AuIn) appears when the In concentration of the Pb–In phase is approximately 0.8 wt. %. The In concentration in the Pb–In phase in the two phase region can be estimated approximately from the relationship $C_{In} = Co - 1.3\ C_{Au}$, where the concentration C is given in wt. % and Co is the In concentration of the alloy.

Although the above examples for the Pb–In–Au system were described using 8 wt. % In, it is readily apparent that the weight percentage of In can be changed and that various phases will be present depending upon the amount of Au and Pb used. This is well within the skill of a metallurgist and reference to existing binary phase diagrams can be utilized for some assistance.

In the systems described above, the intermetallic compound can be formed between the primary superconductor (for instance, Pb) and another metal, or between two metals other than the primary superconductor. For instance, the Pb–In–Au system works particularly well for Josephson tunneling devices when the intermetallic compound is formed between In and Au.

As examples of other ternary alloy films which are likely to contain intermetallic compounds, the following systems are suitable as electrode materials in the manufacture of Josephson tunneling devices: Pb–Bi–Au, Pb–In–Cu, Pb–In–Ag, Pb–Sn–Ag, and Pb–Sn–Au. Although ternary Pb alloy films are described by these examples, other superconducting materials can also be used. In addition, metals such as Sb, Mg, Mn, Ni, and Bi form intermetallic compounds with In, and can be used in electrode materials containing layers of Pb and In.

For all of the examples given, the sequence of deposition of the layers is not critical. Further, the amounts of the various materials used are such as to allow the formation of intermetallic compounds in the composite electrode structure. These intermetallic compounds will be formed in accordance with the relative percentages of the various materials used in the electrode in accordance with the phase diagrams of these materials. An example of this has been discussed with respect to the Pb–In–Au system.

Due to the sequential deposition of these metallic layers, it is unlikely that the intermetallic compounds are uniformly distributed in the alloy films. There is a possibility that some compound formation may occur near the grain boundaries of the film and at the film surface, although it is believed that the bulk of the intermetallic compounds should be present only within a fraction of the film thickness. In fact, in In–Au–Pb films (deposited in that sequence), the intermetallic compound was found to be present only at the bottom of the composite film.

What has been described is an improved Josephson junction device having superior properties. The device is characterized by the use of superconductive electrodes, at least one of which has an intermetallic compound formed in the electrode. In some cases, the intermetallic compound is formed in both the base electrode and the counter electrode. Many materials can be used for the electrodes and for the intermetallic compound forming materials. Further, it is not necessary that the base electrode and the counter electrode have identical structure, or use identical superconductive materials. While the use of intermetallic compounds in the counter electrode will provide symmetrical Josephson junction devices that may be superior, the intermetallic compound will always be formed in at least one of the electrodes. Formation of the intermetallic compound in the electrodes assures a reduction in stress relaxation such as hillock growth from repeated thermal cycling of the devices.

What is claimed is:

1. A tunnel device exhibiting Josephson tunneling current, comprising:
   a first electrode comprised of at least one superconducting material and at least one non-superconducting material forming an intermetallic compound with said at least one superconducting material,
   a tunnel barrier in contact with said first electrode comprised of an insulating layer having atoms of said at least one superconducting material therein and being sufficiently thin that Josephson current can tunnel therethrough, and
   a second electrode in contact with said tunnel barrier, said second electrode being comprised of a superconducting material.

2. A Josephson tunnel device according to claim 1 wherein said at least one intermetallic forming non-superconducting material is present in said first electrode in an amount of 2 – 20 weight percent of said first electrode.

3. A Josephson tunnel device according to claim 1 wherein said second electrode has included therein a non-superconducting material forming an intermetallic compound in said second electrode.

4. A Josephson tunnel device according to claim 1 wherein said second electrode is comprised of at least one superconducting material and at least one non-superconducting material forming an intermetallic compound with said at least one superconducting material.

5. A Josephson tunnel device according to claim 1 wherein said first electrode is comprised of lead.

6. A Josephson tunnel device according to claim 1 wherein said first electrode is comprised of gold.

7. A Josephson tunnel device according to claim 1 wherein said first electrode is comprised of indium.

8. A Josephson tunnel device according to claim 1 wherein said at least one superconducting material is lead and said at least one non-superconducting material is gold.

9. A Josephson tunnel device according to claim 1 wherein said at least one superconducting material includes lead and indium and said at least one non-superconducting material is gold.

10. A Josephson tunnel device according to claim 1 wherein said at least one superconducting material is lead and said at least one non-superconducting material is a non-superconducting material selected from the group consisting of gold, palladium, platinum, magnesium and tellurium.

11. A Josephson tunnel device according to claim 1 wherein said at least one superconducting material is indium and said at least one non-superconducting material is a non-superconducting material selected from the group consisting of copper, silver, gold, magnesium, manganese, nickel, and bismuth.

12. A Josephson tunnel device according to claim 1 wherein said tunnel barrier comprises an oxide.

13. A Josephson tunnel device according to claim 2 wherein said non-superconducting material is present in said first electrode in an amount of 3 – 10 weight percent of said first electrode.

14. A Josephson tunnel device according to claim 3 wherein said non-superconducting material is present in said second electrode in an amount of 2 – 20 weight percent of said second electrode.

15. A Josephson tunnel device according to claim 4 wherein said at least one superconducting material is lead and said at least one non-superconducting material is a non-superconducting material selected from the group consisting of gold, palladium, platinum, magnesium and tellurium.

16. A Josephson tunnel device according to claim 4 wherein said at least one superconducting material is indium and said at least one non-superconducting material in a non-superconducting material selected from the group consisting of copper, silver, gold, magnesium, manganese, nickel and bismuth.

17. A tunnel device exhibiting Josephson tunneling current comprising:
   a first electrode having two superconducting materials therein and a non-superconducting material which forms intermetallic compounds with said two superconducting materials, at least one intermetallic compound thereof being present in said electrode,
   a tunnel barrier on said first electrode being sufficiently thin to permit Josephson tunneling therethrough, and
   a second electrode on the tunnel barrier said second electrode being comprised of a superconducting material.

18. A tunnel device according to claim 17 wherein said first electrode is comprised of a ternary lead alloy film.

19. A tunnel device according to claim 17 wherein said two superconducting materials are lead and indium and said non-superconducting material is gold.

20. A tunnel device according to claim 17 wherein said tunnel barrier is an oxide of at least one of said two superconducting materials.

21. A tunnel device according to claim 17 wherein said tunnel barrier includes atoms of at least one of said superconducting materials.

22. A tunnel device according to claim 18 wherein said ternary lead alloy in Pb–In–Au.

23. A tunnel device according to claim 18 wherein said ternary lead alloy is one selected from the group of ternary lead alloys consisting of Pb–In–Au, Pb–Sn–Au and Pb–In–Mg.

24. A tunneling device exhibiting Josephson tunneling current comprising:
   a first electrode having lead and at least another superconducting material therein and a material which forms intermetallic compounds with each of said lead and said at least another superconducting material, at least one intermetallic compound thereof being present in said electrode;

a tunnel barrier on said first electrode being sufficiently thin to permit Josephson tunneling therethrough; and a second electrode on the tunnel barrier said second electrode being comprised of superconducting material.

25. A tunnel device according to claim 24 wherein said first electrode is comprised of a ternary lead alloy.

26. A tunnel device according to claim 24 wherein said at least another superconducting material is indium and said material which forms intermetallic compounds with said lead and said at least another superconducting material is gold.

27. A tunnel device according to claim 24 wherein said tunnel barrier is an oxide of at least one of said lead and said at least another superconducting material.

28. A tunnel device according to claim 24 wherein said tunnel barrier includes atoms of at least one of said lead and said at least another superconducting material.

29. A tunnel device according to claim 25 wherein said ternary lead alloy is Pb–In–Au.

30. A tunnel device according to claim 25 wherein said ternary lead alloy is one selected from the group of ternary lead alloys consisting of Pb–In–Au, Pb–Bi–In, Pb–Sn–Au and Pb–In–Mg.

31. A tunnel device exhibiting Josephson tunneling current comprising:
a first electrode comprised of at least one superconducting material and at least one non-superconducting intermetallic forming material said non-superconducting material being non-uniformly distributed in said first electrode.
a tunnel barrier in contact with said first electrode comprised of an insulating layer having atoms of said at least one superconducting material therein and being sufficiently thin that Josephson current can tunnel therethrough, and
a second electrode in contact with said tunnel barrier, said second electrode being comprised of a superconducting material.

32. A tunnel device according to claim 31 wherein said at least one non-superconducting intermetallic forming material is present in said first electrode in an amount of 2– 20 weight percent of said first electrode.

33. A Josephson tunnel device according to claim 31 wherein said second electrode has included therein a non-superconducting material forming an intermetallic compound in said second electrode.

34. A Josephson tunnel device according to claim 31 wherein said second electrode is comprised of at least one superconducting material and at least one non-superconducting intermetallic forming material said non-superconducting material being non-uniformly distributed in said second electrode.

35. A Josephson tunnel device according to claim 31 wherein said first electrode is comprised of lead.

36. A Josephson tunnel device according to claim 31 wherein said first electrode is comprised of gold.

37. A Josephson tunnel device according to claim 31 wherein said first electrode is comprised of indium.

38. A Josephson tunnel device according to claim 31 wherein said at least one superconducting material is lead and said at least one non-superconducting material is gold.

39. A Josephson tunnel device according to claim 31 wherein said at least one superconducting material includes lead and indium and said at least one non-superconducting material is gold.

40. A Josephson tunnel device according to claim 31 wherein said at least one superconducting material is lead and said at least one non-superconducting material is a non-superconducting material selected from the group consisting of gold, palladium, platinum, magensium and tellurium.

41. A Josephson tunnel device according to claim 31 wherein said at least one superconducting material is indium and said at least one non-superconducting material is a non-superconducting material selected from the group consisting of copper, silver, gold, magnesium, manganese, nickel and bismuth.

42. A Josephson tunnel device according to claim 31 wherein said tunnel barrier comprises an oxide.

43. A Josephson tunnel device according to claim 32 wherein said non-superconducting material is present in said first electrode in an amount of 3 – 10 weight percent of said first electrode.

44. A Josephson tunnel device according to claim 33 wherein said non-superconducting material is present in said second electrode in an amount of 2 – 20 weight percent of said second electrode.

45. A Josephson tunnel device according to claim 34 wherein said at least one superconducting material is lead and said at least one non-superconducting material is a non-superconducting material selected from the group consisting of gold, palladium, platinum, magnesium and tellurium.

46. A Josephson tunnel device according to claim 34 wherein said at least one superconducting material is indium and said at least one non-superconducting material is a non-superconducting material selected from the group consisting of copper, silver, gold, magnesium, manganese, nickel and bismuth.

47. A tunnel device exhibiting Josephson tunneling current comprising:
a first electrode comprising at least one superconducting material, at least one non-superconducting material and at least one intermetallic compound,
a tunnel barrier in contact with said first electrode comprised of an insulating layer having atoms of said at least one superconducting material therein and being sufficiently thin that Josephson current can tunnel therethrough, and
a second electrode in contact with said tunnel barrier, said second electrode being comprised of a superconducting material.

48. A tunnel device according to claim 47 wherein said first electrode is comprised of lead.

49. A tunnel device according to claim 47 wherein said first electrode is comprised of gold.

50. A tunnel device according to claim 47 wherein said first electrode is comprised of indium.

51. A tunnel device according to claim 47 wherein said first electrode is comprised of a lead based alloy.

52. A tunnel device according to claim 47 wherein said at least one superconducting material is lead and said at least one non-superconducting material is a non-superconducting material selected from the group consisting of gold, palladium, platinum, magnesium and tellurium.

53. A tunnel device according to claim 47 wherein said at least one superconducting material is indium and said at least one non-superconducting material is a non-superconducting material selected from the group consisting of copper, silver, gold, magnesium, manganese, nickel and bismuth.

54. A tunnel device according to claim 31 wherein said tunnel barrier comprises an oxide.

* * * * *

UNITED STATES PATENT AND TRADEMARK OFFICE
CERTIFICATE OF CORRECTION

PATENT NO. : 3,999,203
DATED : December 21, 1976
INVENTOR(S) : S. K. Lahiri

It is certified that error appears in the above-identified patent and that said Letters Patent are hereby corrected as shown below:

Column 12, line 26, change "in" to --is--.

Column 12, line 56, change "in" to --is--.

Column 12, line 59, After "Pb-In-Au" insert --Pb-Bi-In--.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks